United States Patent
Nishiyama

(10) Patent No.: US 9,677,588 B2
(45) Date of Patent: Jun. 13, 2017

(54) COMPONENT MOUNTER MOUNTING HEAD HOLDING DEVICE

(75) Inventor: Satoru Nishiyama, Chiryu (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 409 days.

(21) Appl. No.: 14/372,326

(22) PCT Filed: Jan. 20, 2012

(86) PCT No.: PCT/JP2012/051203
§ 371 (c)(1),
(2), (4) Date: Jul. 15, 2014

(87) PCT Pub. No.: WO2013/108394
PCT Pub. Date: Jul. 25, 2013

(65) Prior Publication Data
US 2014/0328617 A1    Nov. 6, 2014

(51) Int. Cl.
*F16B 17/00*    (2006.01)
*H05K 13/04*    (2006.01)

(52) U.S. Cl.
CPC ......... *F16B 17/00* (2013.01); *H05K 13/0404* (2013.01); *Y10T 403/602* (2015.01); *Y10T 403/70* (2015.01); *Y10T 403/7007* (2015.01)

(58) Field of Classification Search
CPC .... B25J 15/04; B25J 15/0408; B25J 15/0433; H05K 13/04; H05K 13/0404; H05K 13/0408
See application file for complete search history.

(56) References Cited

U.S. PATENT DOCUMENTS 4,621,854 A * 11/1986 Boley .................. B25J 15/04
                                                      294/104
4,664,588 A *  5/1987 Newell ............... B23Q 1/0063
                                                      294/86.4
(Continued)

FOREIGN PATENT DOCUMENTS

JP          3 82197      4/1991
JP       2005 286171    10/2005
JP          4546857      9/2010

OTHER PUBLICATIONS

U.S. Appl. No. 14/424,726, filed Feb. 27, 2015, Nishiyama.
(Continued)

*Primary Examiner* — Michael P Ferguson
(74) *Attorney, Agent, or Firm* — Oblon, McClelland, Maier & Neustadt, L.L.P.

(57) ABSTRACT

A component mounter mounting head holding device for detachably holding a mounting head to a head holding section of a component mounter, including: a pin to be engaged provided on a connection section for a head holding section of the mounting head; an engaging member provided on the head holding section that moves between an engagement position for holding the mounting head in which the engaging member is engaged with the pin and a release position in which the engaging member is separated from the pin; and an air cylinder provided on the head holding section that is a power source for moving the engaging member between the engagement position and the release position. When attaching/detaching the mounting head to/from the head holding section, the head holding section is rotated to a position in which the engaging member can pass by the side of the pin.

5 Claims, 11 Drawing Sheets

(56) References Cited

U.S. PATENT DOCUMENTS

| | | | | |
|---|---|---|---|---|
| 5,083,352 | A | * | 1/1992 | Nakako .................... B23Q 5/58 |
| | | | | 29/57 |
| 5,200,202 | A | * | 4/1993 | Ahn ................... H05K 13/0404 |
| | | | | 294/106 |
| 7,603,766 | B2 | | 10/2009 | Kawada |
| 2006/0207090 | A1 | | 9/2006 | Kawada |

OTHER PUBLICATIONS

International Search Report Issued Feb. 21, 2012 in PCT/JP12/051203 Filed Jan. 20, 2012.
Extended European Search Report issued Jun. 3, 2015 in Patent Application No. 12866384.6.
Office Action issued May 25, 2015 in Japanese Patent Application No. 2013-554160 (with English language translation).

* cited by examiner

Cross section A-A

Cross section B-B

Cross section C-C

COMPONENT MOUNTER MOUNTING HEAD HOLDING DEVICE

TECHNICAL FIELD

The present invention relates to a component mounter mounting head holding device which detachably holds a mounting head for mounting components on a circuit board to a head holding section of a component mounter.

BACKGROUND ART

The component mounter given in patent literature 1 (Japanese Patent Publication Number 4546857) comprises a mounting head holding multiple suction nozzles, wherein the mounting head is attached and held to a head holding section of a component mounter using negative air pressure in order to be capable of being automatically exchanged according to circumstances such as the type, shape, and size of components.

CITATION LIST

Patent Literature

Patent Literature 1: Japanese Patent Publication Number 4546857

SUMMARY OF INVENTION

Problem to be Solved by the Invention

The speed of recent component mounters continues to increase more and more in order to enhance productivity, and the inertial force acting on mounting heads during operation of component mounters is getting larger. Due to this, as in patent literature 1, with configurations which attach and hold mounting heads to the head holding section of a component mounter with negative air pressure, the holding force of the mounting head is insufficient, so the mounting head may slip on the attachment surface of the head holding section while the component mounter is operating causing the position to deviate so that component pickup defects or mounting defects occur, or the mounting head may fall off.

Therefore, the object of the present invention is a component mounter mounting head holding device which prevents a mounting head that is detachably held to a head holding section of a component mounter from deviating positionally or falling off.

Means for Solving the Problem

To solve the above problem, the present invention is a component mounter mounting head holding device for detachably holding a mounting head which mounts components to a circuit board to a head holding section of a component mounter, comprising: a member to be engaged provided on the connecting section for the head holding section of the mounting head; an engaging member provided on the head holding section which moves between an engagement position for holding the mounting head in which the engaging member is engaged with the member to be engaged and a release position in which the engaging member is separated from the member to be engaged; and an air cylinder provided on the head holding section which is the power source for moving the engaging member between the engagement position and the release position. With this configuration, because a mounting head can be held mechanically on the head holding section by the engaging member of the head holding section being engaged with the member to be engaged of the mounting head, the holding power of the mounting head can be increased more than conventional negative pressure attachment power, and it is possible to prevent a mounting head which is detachably held to the head holding section from deviating positionally or falling off.

Here, it is preferable to form the engaging member of the head holding section in an L-shape or J-shape which holds the member to be engaged of the mounting head by hooking it from underneath.

Also, the engaging member may be provided on the head holding section so that it is capable of being moved up and down with the uppermost position and lowermost position of that movement stroke being the engagement position and release position respectively. With this configuration, when attaching/detaching the mounting head to/from the head holding section, if the respective positions of the head holding section and the mounting head are not shifted, it is not possible for the engaging member of the head holding section to pass by the side of the member to be engaged of the mounting head. Because the head holding section of a component mounter is generally configured to be capable of being rotated around its center axis (Z axis) by a rotating mechanism, if that rotating mechanism is used, the respective positions of the head holding section and the mounting head can be shifted and the mounting head can be attached/detached to/from the head holding section.

Specifically, when attaching a mounting head to the head holding section, it is acceptable, together with holding the engaging member in the release position using an air cylinder and having the head holding section rotated to a position in which the engaging member can pass by the side of the member to be engaged, to lower the head holding section so that it is face-to-face with the mounting head, and then, by raising the engaging member to the engagement position using the air cylinder after rotating the head holding section so that the lower section of the engaging member is below the member to be engaged, engaging the engaging member with the member to be engaged and attaching the mounting head to the head holding section. Conversely, when detaching a mounting head from the head holding section, it is acceptable to rotate the head holding section to a position in which the engaging member can pass by the side of the member to be engaged after lowering the engaging member to the release position using an air cylinder, and then detach the mounting head from the head holding section by raising the head holding section.

Alternatively, the configuration may be such that the engaging member is provided on the head holding section so that it is capable of being rotated around a rotating axis, with one direction position of that rotation stroke and another direction position thereof being the engagement position and release position respectively. With this configuration, when attaching/detaching the mounting head to/from the head holding section, even if the respective positions of the head holding section and the mounting head are not shifted, if the engaging member of the head holding section is held in a state rotated to the release position, it is possible for the engaging member of the head holding section to pass by the side of the member to be engaged of the mounting head, and the mounting head can be attached/detached.

With this configuration it is acceptable, when attaching a mounting head to the head holding section, with the engaging member in a state rotated to and held in the release position using an air cylinder, after lowering the head holding section so that it is face-to-face with the mounting head, for the engaging member to be engaged with the member to be engaged and the mounting head to be attached to the head holding section by rotating the engaging member to the engagement position using the air cylinder. Conversely, when detaching a mounting head from the head holding section, it is acceptable to detach the mounting head from the head holding section by raising the head holding section after rotating the engaging member to the release position using an air cylinder.

Also, for the present invention, it is also preferable to provide an elastic member for biasing the engaging member in the engagement position direction on the head holding section. By doing this, the power of the air cylinder used to hold the engaging member and the member to be engaged in an engaged state can be supplemented by the elastic force of the elastic member and the holding capacity of the mounting head can be enhanced.

Further, the mounting head which is detachably held to a head holding section may be a rotary head with multiple suction nozzles for picking up components arranged in a circumferential direction at predetermined intervals, a mounting head with only one large suction nozzle attached, or a mounting head with a chuck for grabbing components attached.

DESCRIPTION OF EMBODIMENTS

Figure 1:
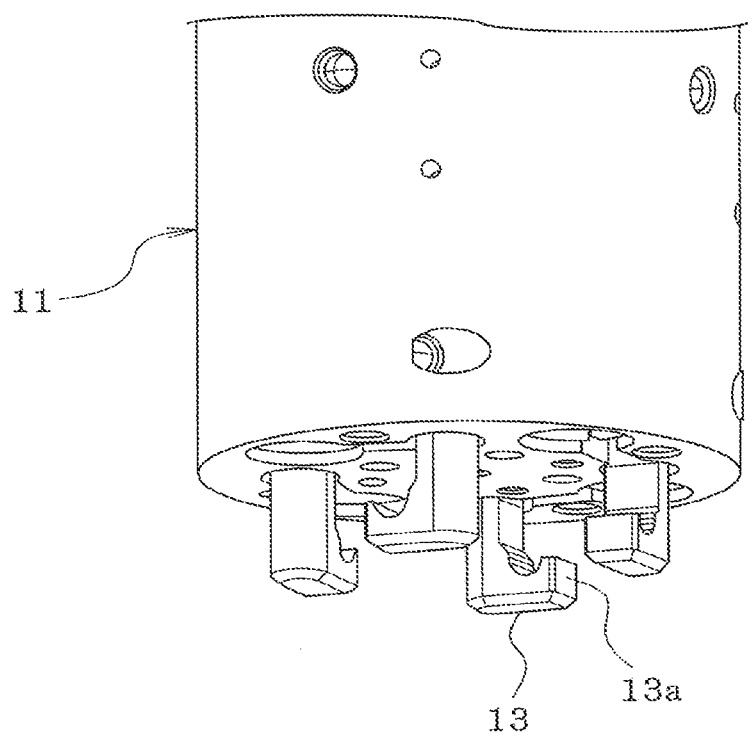
FIG. 1 is an exterior perspective view of the head holding section of embodiment 1 of the present invention as seen diagonally from below.

The following describes two modes for carrying out the invention, embodiment 1 and embodiment 2.

Embodiment 1

This describes embodiment 1 of the present invention based on FIG. 1 to FIG. 6. Multiple (for example, four) engaging members 13 for detachably engaging and holding mounting head 12 (refer to FIG. 2) are provided movably in the up/down direction on head holding section 11 of the component mounter. Although not shown in the figures, head holding section 11 is configured such that, as well as being capable of being moved in the XYZ directions by an XYZ moving mechanism, is capable of being rotated around the center axis (Z axis) of said head holding section 11 by a rotating mechanism. Mounting head 12 is a rotary head with multiple suction nozzles (not shown in figures) for picking up components arranged in a circumferential direction at predetermined intervals.

Multiple engaging members 13 are formed respectively as L-shapes or J-shapes and are arranged at even intervals in a circumferential direction with the center axis (Z axis) of head holding section 11 as the center, and the direction of claw section 13a of each engaging member 13 is arranged so as to be facing in the same direction as the normal rotational direction (or the reverse rotational direction) of head holding section 11.

Figure 2:
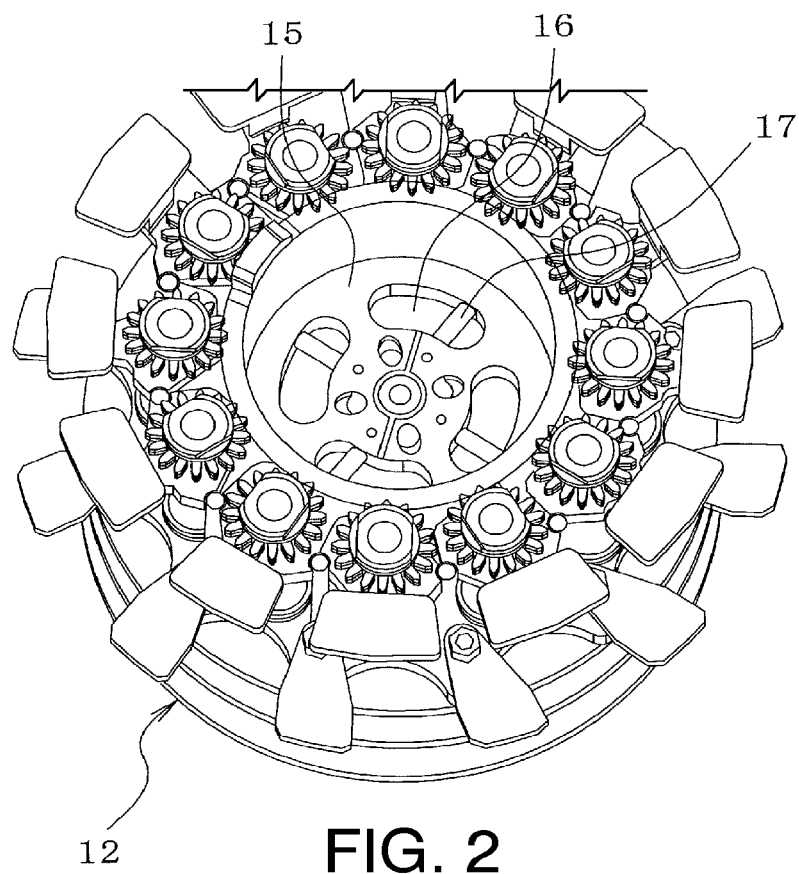
FIG. 2 is an exterior perspective view of the mounting head of embodiment 1 as seen diagonally from above.

As shown in FIG. 2, multiple elongated holes 16 are formed at even intervals in a circumferential direction on connecting section 15 for the head holding section 11 of mounting head 12 in order for each engaging member 13 of head holding section 11 to pass through, and pin to be engaged 17 which is a member to be engaged that is engaged by claw section 13a of engaging member 13 is fixedly penetrating on one side of each elongated hole 16 in the radial direction of mounting head 12. To the side of pin to be engaged 17 of each elongated hole 16, a gap is maintained so that engaging member 13 can pass by in the up/down direction.

Figure 3:
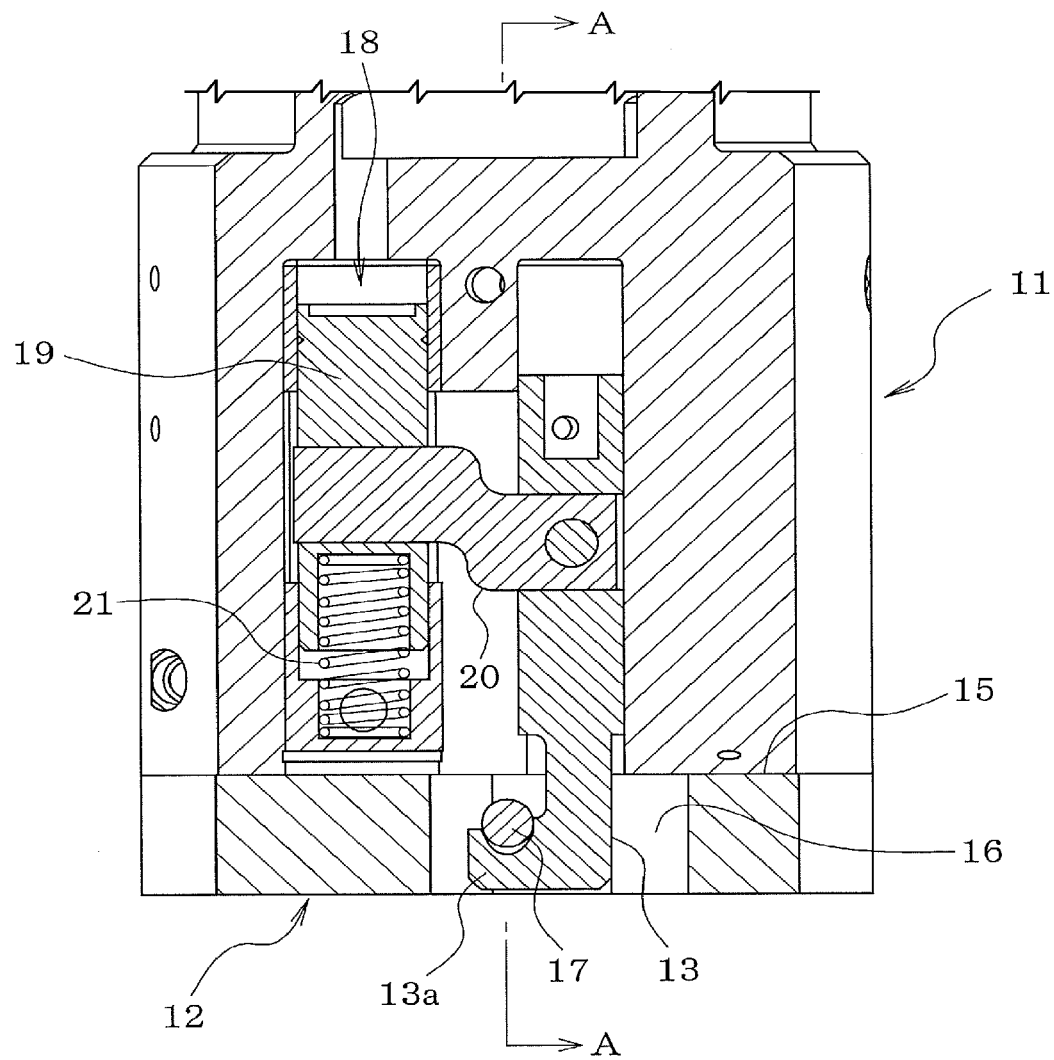
FIG. 3 is a longitudinal section showing the engaging member of the head holding section of embodiment 1 in an engaged state with the pin to be engaged of the mounting head.
Figure 5:
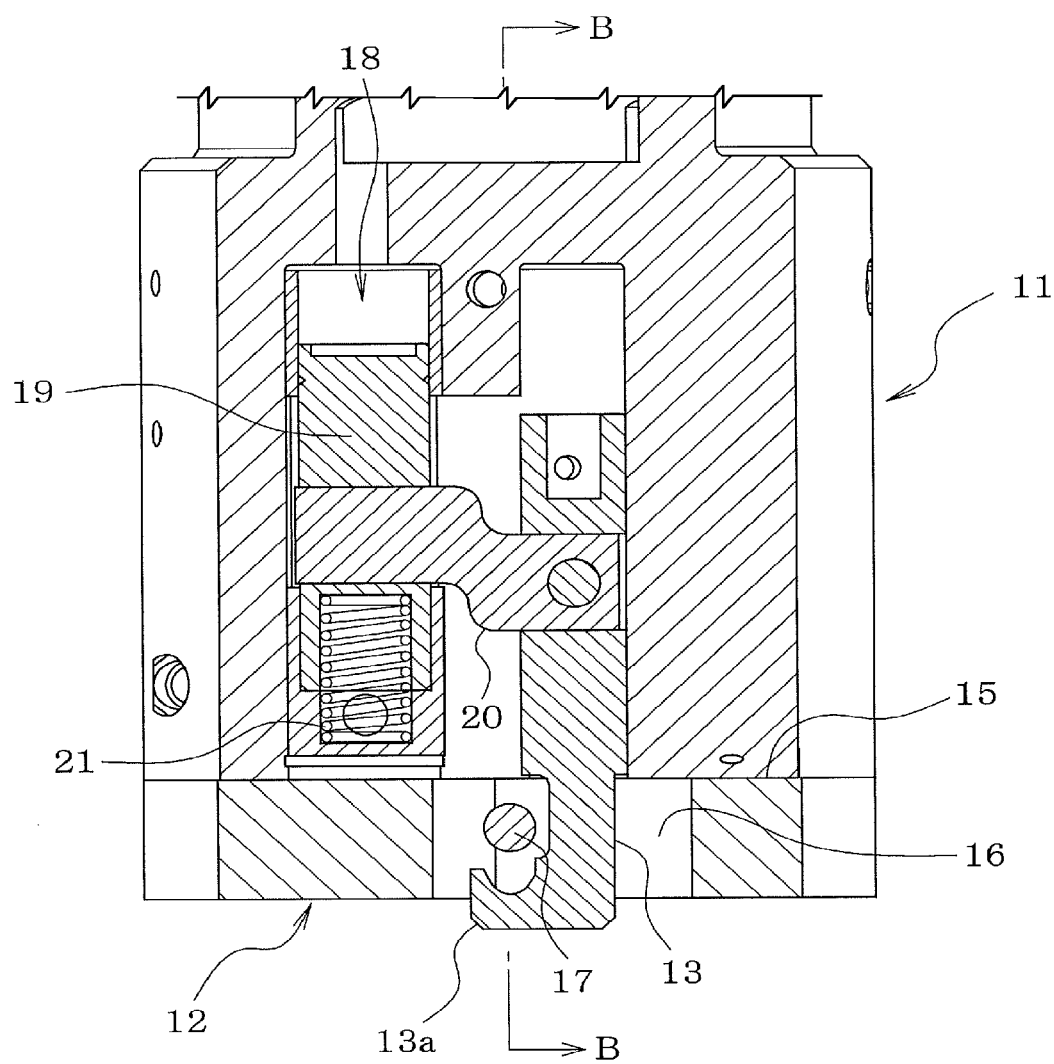
FIG. 5 is a longitudinal section showing the engaging member of head holding section of embodiment 1 in a state lowered to the release position.

As shown in FIG. 3 and FIG. 5, air cylinders 18 for moving each engaging member 13 respectively in the up/down direction are provided close to each engaging member 13 of head holding section 11. Engaging member 13 is connected via arm 20 to piston 19 of each air cylinder 18, piston 19 is moved up/down and engaging member 13 moves in the up/down direction, and the uppermost position and lowermost position of that movement stroke are the engagement position and release position respectively.

Figure 4:
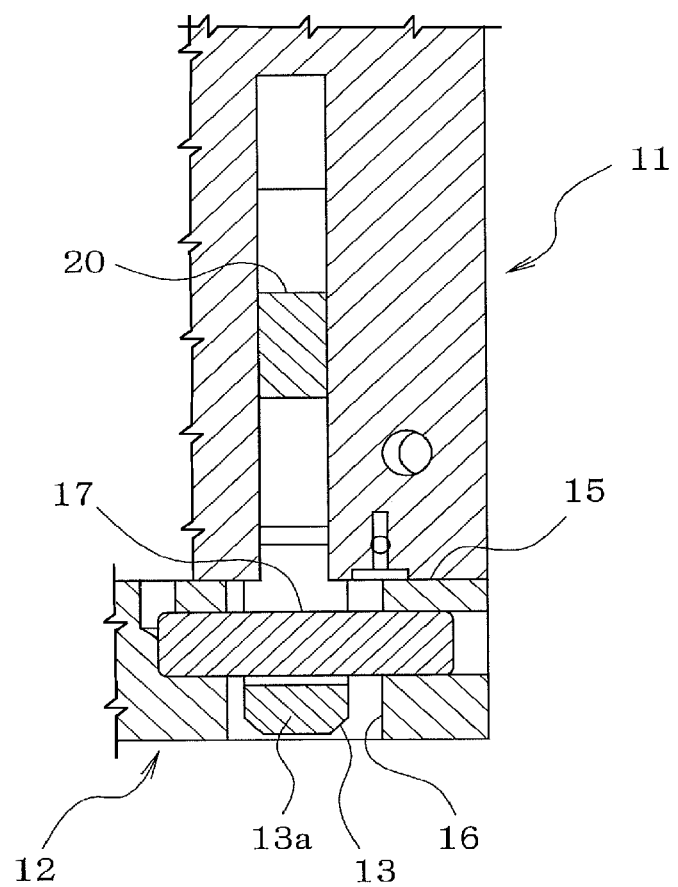
FIG. 4 is a longitudinal section showing the view along the line A-A of FIG. 3.
Figure 6:
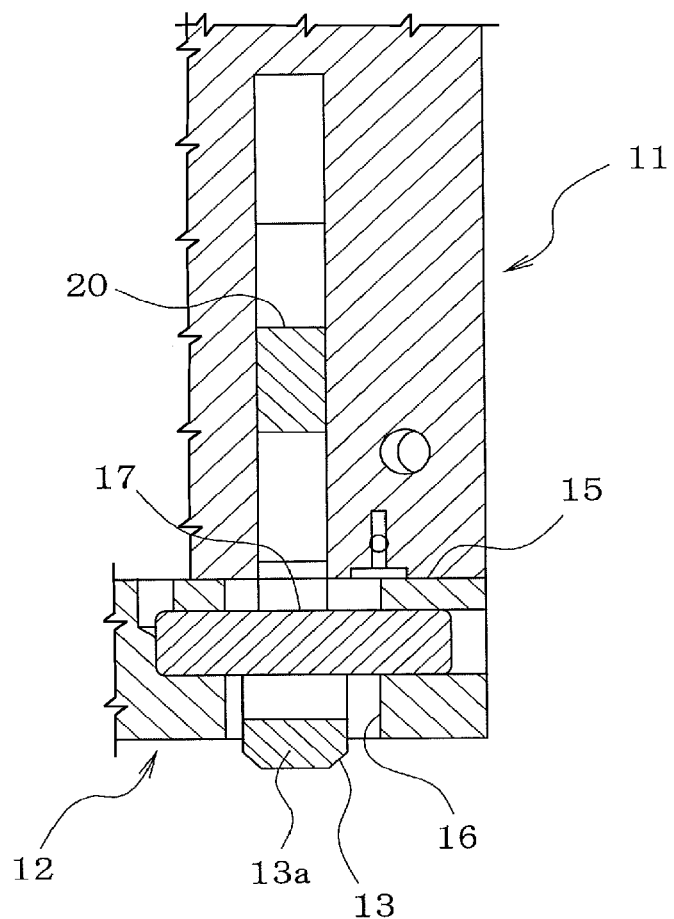
FIG. 6 is a longitudinal section showing the view along the line B-B of FIG. 5.
Figure 7:
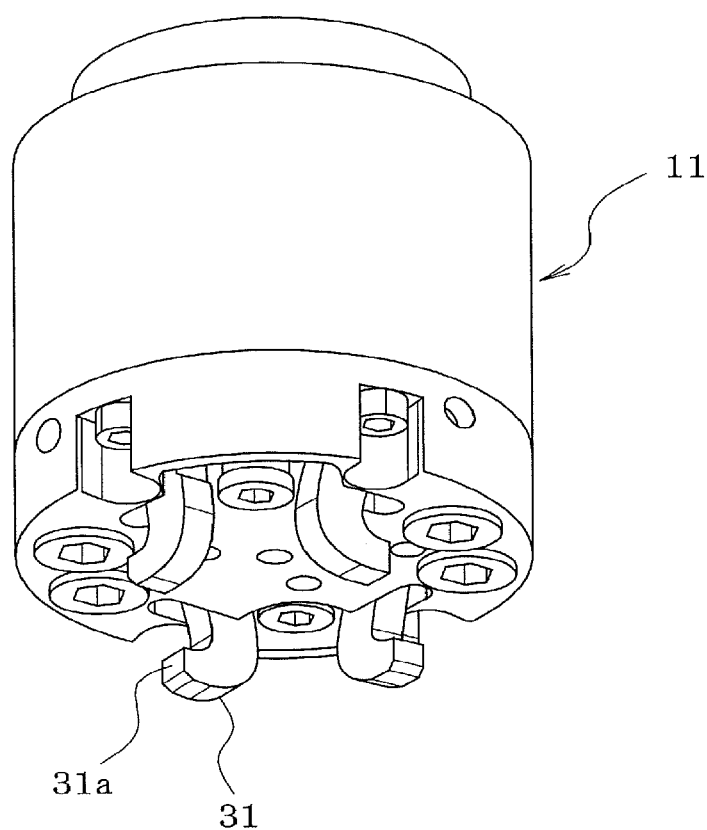
FIG. 7 is an exterior perspective view of the head holding of embodiment 2 of the present invention as seen diagonally from below.
Figure 8:
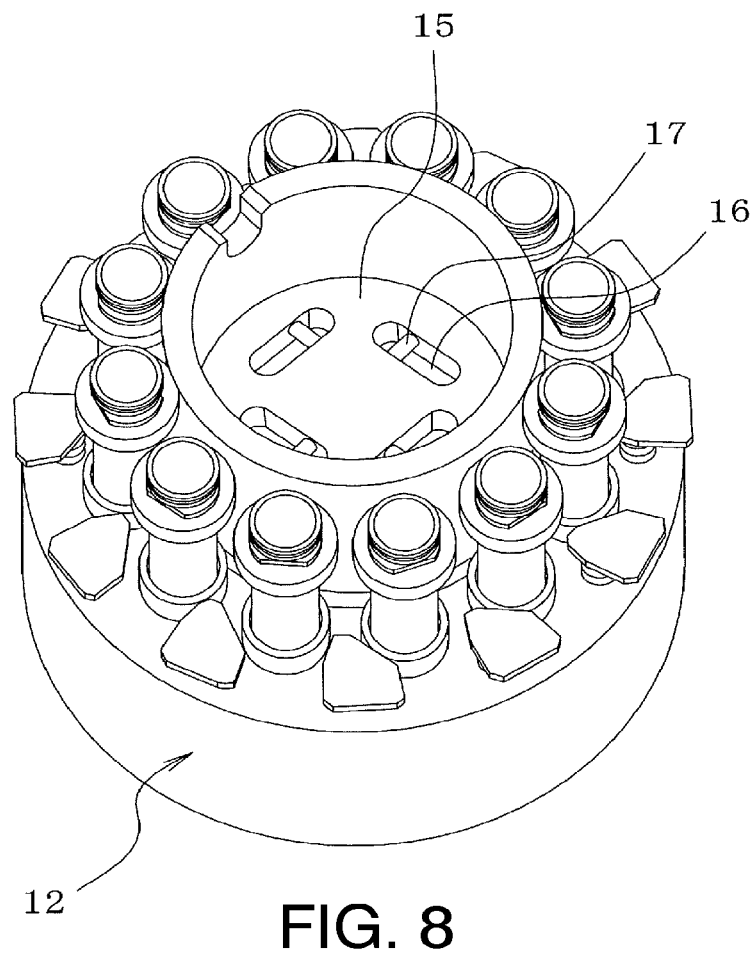
FIG. 8 is an exterior perspective view of the mounting head of embodiment 2 as seen diagonally from above.

As shown in FIG. 3 and FIG. 4, when engaging member 13 is raised to the engagement position, mounting head 12 is in a held state by claw section 13a of engaging member 13 hooking from the underneath pin to be engaged 17. Conversely, as shown in FIG. 5 and FIG. 6, when engaging member 13 is lowered from the engagement position to the release position, claw section 13a of engaging member 13 moves under pin to be engaged 17 and the engagement is released.

Spring 21 (elastic member) such as a compression coil spring for biasing piston 19 in the up direction which is the engagement position direction is provided below piston 19 of each air cylinder 18. Further, it is acceptable to provide the elastic member such as a spring for biasing engaging member 13 in the engagement position direction close to engaging member 13. The space above and the space below piston 19 of each air cylinder 18 are respectively configured such that it is possible to switch between a state connected to a compressed air supply system for supplying compressed air and a state connected to an exhaust system for exhausting air.

If compressed air is supplied to the space below piston 19 of air cylinder 18 with the space above piston 19 in a state connected to an exhaust system, as shown in FIG. 3 and FIG. 4, piston 19 is pushed up by the pressure of the compressed air and the elastic force of spring 21 such that engaging member 13 rises to the engagement position. And, if compressed air is supplied to the space above piston 19 with the space below piston 19 in a state connected to an exhaust system, as shown in FIG. 5 and FIG. 6, piston 19 is pushed down against the elastic force of spring 21 by the pressure of the compressed air such that engaging member 13 lowers to the release position.

Further, the configuration may be such that negative pressure (vacuum pressure) is supplied instead of compressed air to the space above and the space below piston 19 of each air cylinder 18, in which case it is acceptable to supply negative pressure to the space above piston 19 when raising engaging member 13 to the engagement position and to supply negative pressure to the space below piston 19 when lowering engaging member 13 to the release position.

Next, the following describes the usage method of the mounting head holding device of the above configuration. When attaching mounting head 12 to head holding section 11, together with moving head holding section 11 above mounting head 12 loaded in the mounting head exchange station of the component mounter, piston 19 of air cylinder 18 is pushed down against the elastic force of spring 21 such that engaging member 13 is held in a state lowered to the release position, and head holding section 11 is rotated to a position in which it is possible for claw section 13a of engaging member 13 to pass by the side of pin to be engaged 17. In this state, after lowering head holding section 11 to be facing mounting head 12 with claw section 13a of engaging member 13 lowered to be lower than pin to be engaged 17, head holding section 11 is rotated and, as shown in FIG. 5 and FIG. 6, claw 13a of engaging member 13 is made to be in a position below pin to be engaged 17. After this, as shown in FIG. 3 and FIG. 4, claw section 13a of engaging member 13 is engaged with pin 17 to be engaged by raising piston 19 of air cylinder 18 and raising engaging member 13 to the engagement position. By this, mounting head 12 becomes attached to head holding section 11.

Conversely, when detaching mounting head 12 from head holding section 11, after moving head holding section 11 above mounting head exchange station and loading mounting head 12 held by head holding section 11 into the mounting head exchange station, as shown in FIG. 5 and FIG. 6, piston 19 of air cylinder 18 is pushed down against the elastic force of spring 21 such that engaging member 13 is lowered to the release position and claw section 13a of engaging member 13 is made to be separated from pin to be engaged 17 on the lower side. In this state, head holding section 11 is raised after head holding section 11 is rotated to a position in which engaging member 13 can pass by the side of pin to be engaged 17. By this, mounting head 12 is detached from head holding section 11 and remains in the mounting head exchange station.

With embodiment 1 described above, because the configuration is such that mounting head 12 is held mechanically on head holding section 11 by engaging member 13 of head holding section 11 being engaged with pin to be engaged 17 of mounting head 12, the holding power of mounting head 12 can be increased more than conventional negative pressure attachment power, and it is possible to prevent mounting head 12 which is detachably held to head holding section 11 from deviating positionally or falling off even when electricity is not being supplied.

Embodiment 2

Next, this describes embodiment 2 of the present invention based on FIG. 7 to FIG. 11. However, for sections which are practically the same as embodiment 1, the same symbols are used and explanations are omitted or abbreviated, with the sections which are largely different being described.

In embodiment 1 above, the configuration was such that multiple engaging members 13 were provided on head holding section 11 capable of being moved up and down, but with embodiment 2 shown in FIG. 7 to FIG. 11, multiple engaging members 31 are provided on head holding section 11 capable of being rotated in a perpendicular direction to pin to be engaged 17 via rotational axis 32, with one direction (the pin to be engaged 17 side) position and another direction position of that rotation stroke being the engagement position and release position respectively. Each engaging member 31 is formed as a whole in a roughly chevron shape, with the bend section thereof penetrated by rotational axis 32, with the lower section of engaging member 31 formed in an L-shape or J-shape, the tip of which is claw section 31a for engaging with pin to be engaged 17, and with the upper section of engaging member 31 extending above air cylinder 18, in the tip of which is formed elongated hole 33, with this elongated hole 33 engaged in a freely sliding manner with fixed pin 34 which is fixed to piston 19 of air cylinder 18. By this, engaging member 31 is rotated between the engagement position and the release position by moving piston 19 of air cylinder 18 up/down. Spring 35 such as a torsion coil spring which is an elastic member for biasing engaging member 31 in the direction of the engagement position is provided on head holding section 11 close to each engaging member 31. Further, it is acceptable to provide the elastic member such as a spring for biasing engaging member 31 in the engagement position direction inside air cylinder 18.

Figure 9:
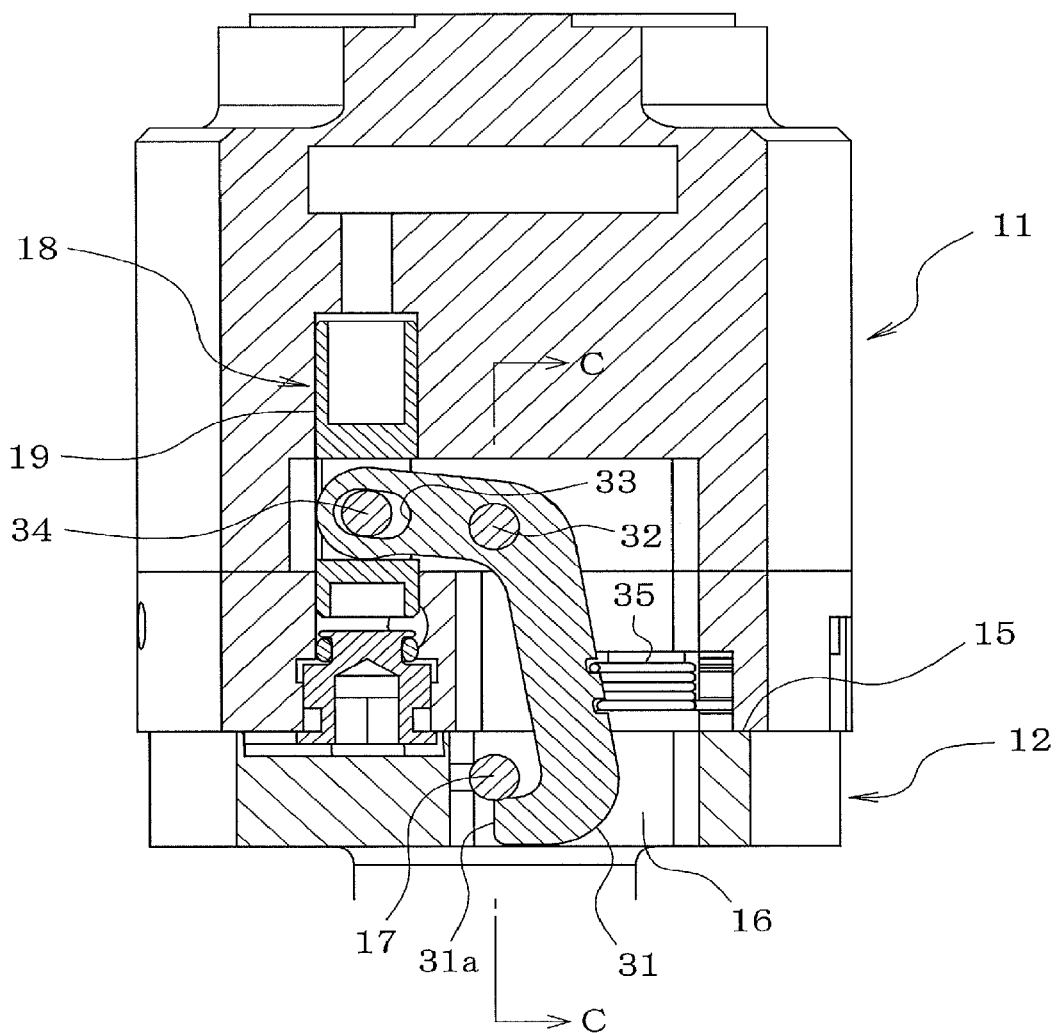
FIG. 9 is a longitudinal section showing the engaging member of the head holding section of embodiment 2 in an engaged state with the pin to be engaged of the mounting head.
Figure 10:
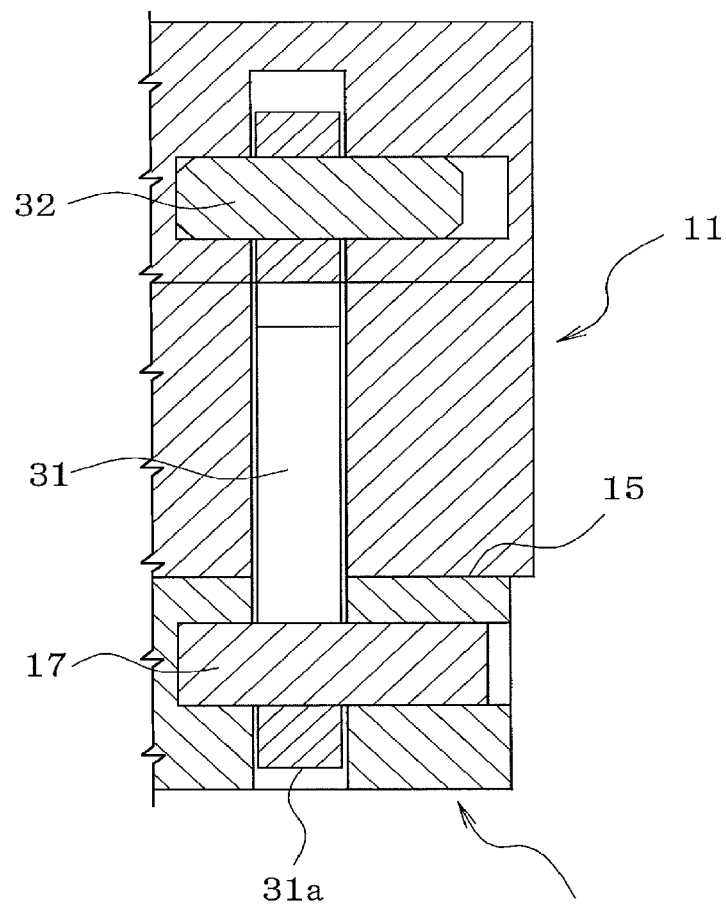
FIG. 10 is a longitudinal section showing the view along the line C-C of FIG. 9.
Figure 11:
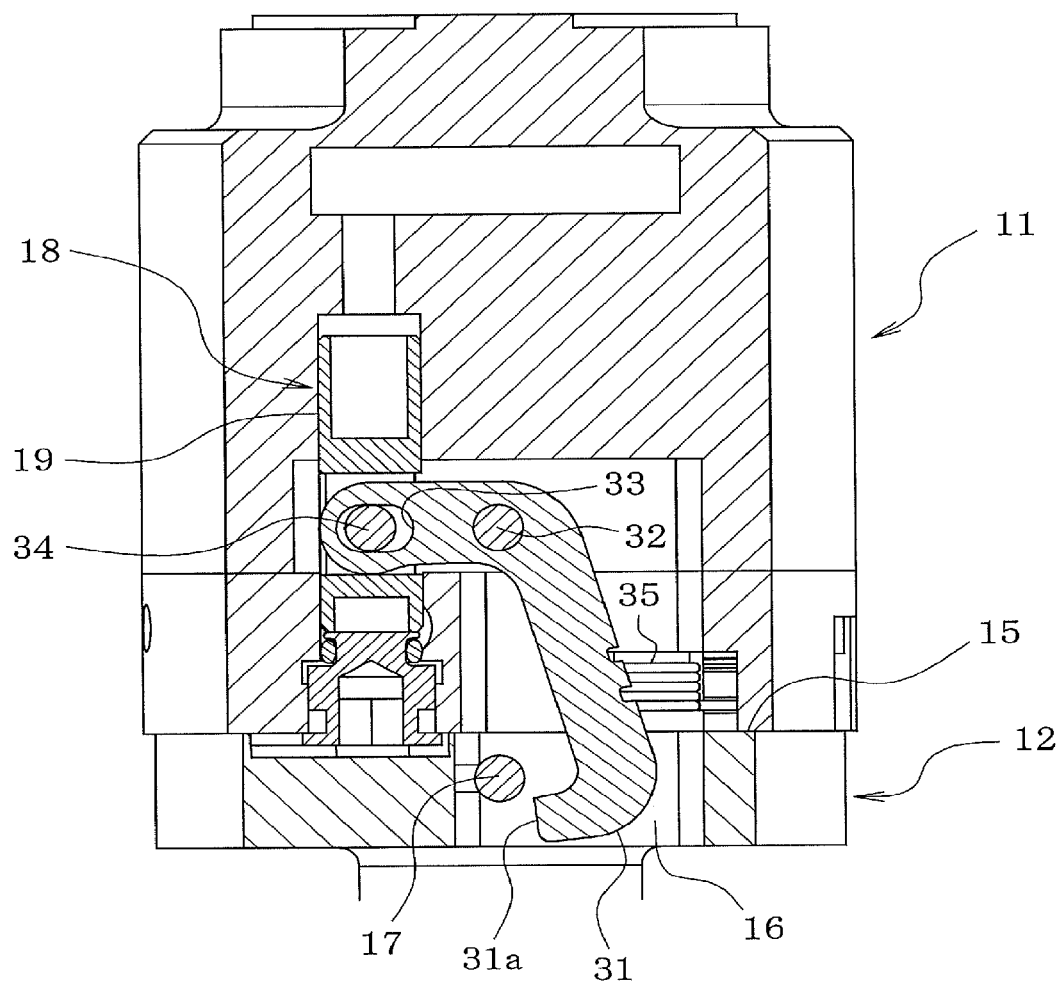
FIG. 11 is a longitudinal section showing the engaging member of head holding section of embodiment 2 in a state rotated to the release position.

Next, the following describes the usage method of the mounting head holding device of the above configuration. When attaching mounting head 12 to head holding section 11, together with moving head holding section 11 above mounting head 12 loaded in the mounting head exchange station of the component mounter, as shown in FIG. 11, piston 19 of air cylinder 18 is pushed down against the elastic force of spring 35 such that engaging member 31 is held in a state rotated to the release position. In this state, after lowering head holding section 11 to be facing mounting head 12, as shown in FIG. 9, claw section 31a of engaging member 31 is engaged with pin to be engaged 17 by raising piston 19 of air cylinder 18 and rotating engaging member 31 to the engagement position. By this, mounting head 12 becomes attached to head holding section 11.

Conversely, when detaching mounting head 12 from head holding section 11, after moving head holding section 11 above the mounting head exchange station and loading mounting head 12 held by head holding section 11 into the mounting head exchange station, as shown in FIG. 11, after piston 19 of air cylinder 18 is pushed down such that engaging member 31 is held in a state rotated to the release position against the elastic force of spring 35, head holding section 11 is raised. By this, mounting head 12 is detached from head holding section 11 and remains in the mounting head exchange station.

With embodiment 2 described above, when attaching/detaching mounting head 12 to/from head holding section 11, even if head holding section 11 is not rotated with respect to mounting head 12, if engaging member 31 of head holding section 11 is held in a state rotated to the release position, it is possible for engaging member 31 of head holding section 11 to pass by the side of pin to be engaged 17 of mounting head 12, and the attachability/detachability of mounting head 12 can be improved.

Further, mounting head 12 which is detachably held to head holding section 11 is not limited to being a rotary head, and may be a mounting head with only one large suction nozzle attached, or a mounting head with a chuck for grabbing components attached.

In addition, the present invention may be embodied with various changes that do not extend beyond the scope of the invention, such as changing the quantity of engaging members and members to be engaged, or changing the form of the engaging members and members to be engaged.

SYMBOL DESCRIPTIONS

11: Head holding section; 12: Mounting head; 13: Engaging member; 13a: Claw section; 15: Connecting section; 16: Elongated hole; 17: Pin to be engaged (member to be engaged); 18: Air cylinder; 19: Piston; 21: Spring (elastic means); 31: Engaging member; 31a: Claw section; 32: Rotating axis; 33: Elongated hole; 34: Fixed pin; 35: Spring (elastic means)

What is claimed is:

1. A mounting head holding device including a head holding section that detachably holds a mounting head that mounts components to a circuit board, comprising:

an engaging member provided on the head holding section that moves between an engagement position for holding the mounting head in which the engaging member is engaged with a member-to-be-engaged on the mounting head and a release position in which the engaging member is separated from the member-to-be-engaged; and an air cylinder provided on the head holding section that is a power source for moving the engaging member between the engagement position and the release position, wherein the engaging member moves linearly in an axial direction of the mounting head holding device between the engagement position and the release position, wherein the engaging member is configured to be moved up and down in the axial direction of the mounting head such that an uppermost position and lowermost position are the engagement position and release position respectively, when attaching the mounting head to the head holding section, together with holding the engaging member in the release position using the air cylinder and having the head holding section rotated to a position in which the engaging member can pass by a side of the member-to-be-engaged, the head holding section is lowered to be face-to-face with the mounting head, and then after rotating the head holding section so that a lower section of the engaging member is below the member-to-be-engaged, by raising the engaging member linearly in the axial direction to the engagement position using the air cylinder, the engaging member is engaged with the member-to-be-engaged thereby attaching the mounting head to the head holding section, and when detaching the mounting head from the head holding section after lowering the engaging member to the release position using the air cylinder, the head holding section is rotated to a position in which the engaging member can pass by the side of the member-to-be-engaged, and then the mounting head is detached from the head holding section by raising the head holding section.

2. The mounting head holding device according to claim 1, wherein the engaging member is formed in an L-shape or J-shape that hooks from underneath and holds the member-to-be-engaged.

3. The mounting head holding device according to claim 1, further comprising:

an elastic member for biasing the engaging member in an engagement position direction.

4. The mounting head holding device according to claim 1, wherein the mounting head is a rotary head with multiple suction nozzles for picking up components arranged in a circumferential direction at predetermined intervals.

5. The mounting head holding device according to claim 1, wherein the head holding section is rotated so that a horizontal portion of the engaging member is below the member-to-be-engaged and the air cylinder raises the engaging member linearly in the axial direction to engage the engaging member with the member-to-be-engaged in the engagement position.

* * * * *